(12) United States Patent
Kwang et al.

(10) Patent No.: US 7,723,831 B2
(45) Date of Patent: May 25, 2010

(54) SEMICONDUCTOR PACKAGE HAVING DIE WITH RECESS AND DISCRETE COMPONENT EMBEDDED WITHIN THE RECESS

(75) Inventors: Chua Swee Kwang, Singapore (SG); Chia Yong Poo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 197 days.

(21) Appl. No.: 11/767,889

(22) Filed: Jun. 25, 2007

(65) Prior Publication Data

US 2008/0284003 A1    Nov. 20, 2008

(30) Foreign Application Priority Data

May 17, 2007    (SG)    ............................... 200703559

(51) Int. Cl.
*H01L 23/02* (2006.01)
(52) U.S. Cl. ............... 257/685; 257/686; 257/E23.038; 257/E23.039; 257/E23.069; 257/E23.085
(58) Field of Classification Search ................. 257/686, 257/734, 680, 685, 723, 773–777, E23.023, 257/E23.069, E23.038, E23.039
See application file for complete search history.

(56) References Cited

U.S. PATENT DOCUMENTS

| | | | |
|---|---|---|---|
| 5,518,964 A | 5/1996 | DiStefano et al. |
| 5,607,833 A | 3/1997 | Gilman et al. |
| 5,659,952 A | 8/1997 | Kovac et al. |
| 5,688,716 A | 11/1997 | DiStefano et al. |
| 5,706,174 A | 1/1998 | DiStefano et al. |
| 5,798,286 A | 8/1998 | Faraci et al. |
| 5,801,441 A | 9/1998 | DiStefano et al. |
| 5,830,782 A | 11/1998 | Smith et al. |
| 5,913,109 A | 6/1999 | Distefano et al. |

(Continued)

FOREIGN PATENT DOCUMENTS

CN    1196869(A)    10/1998

(Continued)

OTHER PUBLICATIONS

Charles A. Harper, Electronic Packaging and Interconnection Handbook, 2000, McGraw-Hill, 3rd Edition, p. 1.9.*

(Continued)

*Primary Examiner*—Brook Kebede
(74) *Attorney, Agent, or Firm*—Stephen A. Gratton

(57) ABSTRACT

A semiconductor package includes a substrate having contacts, and a discrete component on the substrate in electrical communication with the contacts. The package also includes a semiconductor die on the substrate in electrical communication with the contacts, and a die attach polymer attaching the die to the substrate. The die includes a recess, and the discrete component is contained in the recess encapsulated in the die attach polymer. A method for fabricating the package includes the steps of: attaching the discrete component to the substrate, placing the die attach polymer on the discrete component and the substrate, pressing the die into the die attach polymer to encapsulate the discrete component in the recess and attach the die to the substrate, and then placing the die in electrical communication with the discrete component. An electronic system includes the semiconductor package mounted to a system substrate.

10 Claims, 7 Drawing Sheets

U.S. PATENT DOCUMENTS

| | | | |
|---|---|---|---|
| 5,915,170 | A | 6/1999 | Raab et al. |
| 5,918,112 | A | 6/1999 | Shah et al. |
| 5,959,354 | A | 9/1999 | Smith et al. |
| 5,983,492 | A | 11/1999 | Fjelstad |
| 5,989,936 | A | 11/1999 | Smith et al. |
| 6,012,224 | A | 1/2000 | DiStefano et al. |
| 6,046,076 | A | 4/2000 | Mitchell et al. |
| 6,080,603 | A | 6/2000 | Distefano et al. |
| 6,104,087 | A | 8/2000 | DiStefano et al. |
| 6,117,694 | A | 9/2000 | Smith et al. |
| 6,126,428 | A | 10/2000 | Mitchell et al. |
| 6,133,639 | A | 10/2000 | Kovac et al. |
| 6,147,400 | A | 11/2000 | Faraci et al. |
| 6,169,328 | B1 | 1/2001 | Mitchell et al. |
| 6,175,241 | B1 | 1/2001 | Hembree et al. |
| 6,177,636 | B1 | 1/2001 | Fjelstad |
| 6,191,368 | B1 | 2/2001 | Di Stefano et al. |
| 6,194,291 | B1 | 2/2001 | DiStefano et al. |
| 6,217,972 | B1 | 4/2001 | Beroz et al. |
| 6,228,685 | B1 | 5/2001 | Beroz et al. |
| 6,228,686 | B1 | 5/2001 | Smith et al. |
| 6,229,100 | B1 | 5/2001 | Fjelstad |
| 6,239,384 | B1 | 5/2001 | Smith et al. |
| 6,265,765 | B1 | 7/2001 | DiStefano et al. |
| 6,281,588 | B1 | 8/2001 | Di Stefano et al. |
| 6,307,260 | B1 | 10/2001 | Smith et al. |
| 6,329,607 | B1 | 12/2001 | Fjelstad et al. |
| 6,338,982 | B1 | 1/2002 | Beroz et al. |
| 6,361,959 | B1 | 3/2002 | Beroz et al. |
| 6,365,436 | B1 | 4/2002 | Faraci et al. |
| 6,365,975 | B1 | 4/2002 | DiStefano et al. |
| 6,370,032 | B1 | 4/2002 | DiStefano et al. |
| 6,391,681 | B1 | 5/2002 | Corisis |
| 6,396,292 | B2 | 5/2002 | Hembree et al. |
| 6,420,661 | B1 | 7/2002 | Di Stefano et al. |
| 6,429,112 | B1 | 8/2002 | Smith et al. |
| 6,486,003 | B1 | 11/2002 | Fjelstad |
| 6,486,547 | B2 | 11/2002 | Smith et al. |
| 6,499,216 | B1 | 12/2002 | Fjelstad |
| 6,507,114 | B2 | 1/2003 | Hui et al. |
| 6,521,480 | B1 | 2/2003 | Mitchell et al. |
| 6,525,429 | B1 | 2/2003 | Kovac et al. |
| 6,541,852 | B2 | 4/2003 | Beroz et al. |
| 6,552,427 | B2 | 4/2003 | Moden |
| 6,570,101 | B2 | 5/2003 | Stefano et al. |
| 6,582,992 | B2 | 6/2003 | Poo et al. |
| 6,635,553 | B1 | 10/2003 | DiStefano et al. |
| 6,638,792 | B2 | 10/2003 | Hui et al. |
| 6,660,558 | B1 | 12/2003 | Bolken et al. |
| 6,687,842 | B1 | 2/2004 | DiStefano et al. |
| 6,690,186 | B2 | 2/2004 | Fjelstad |
| 6,723,584 | B2 | 4/2004 | Kovac et al. |
| 6,737,265 | B2 | 5/2004 | Beroz et al. |
| 6,774,317 | B2 | 8/2004 | Fjelstad |
| 6,784,525 | B2 | 8/2004 | Kuan et al. |
| 6,825,569 | B2 | 11/2004 | Jiang et al. |
| 6,826,827 | B1 | 12/2004 | Fjelstad |
| 6,828,668 | B2 | 12/2004 | Smith et al. |
| 6,835,599 | B2 | 12/2004 | Kuan et al. |
| 6,836,961 | B2 | 1/2005 | Kang |
| 6,848,173 | B2 | 2/2005 | Fjelstad et al. |
| 6,870,272 | B2 | 3/2005 | Kovac et al. |
| 6,876,212 | B2 | 4/2005 | Fjelstad |
| 6,891,248 | B2 | 5/2005 | Akram et al. |
| 6,903,449 | B2 | 6/2005 | Kim et al. |
| 6,927,497 | B2 | 8/2005 | Meyers |
| 6,949,834 | B2 | 9/2005 | Connell et al. |
| 6,965,158 | B2 | 11/2005 | Smith et al. |
| 6,995,448 | B2 | 2/2006 | Lee et al. |
| 7,002,248 | B2 | 2/2006 | Akram et al. |
| 7,008,822 | B2 | 3/2006 | Bolken et al. |
| 7,041,537 | B2 | 5/2006 | Akram et al. |
| 7,049,173 | B2 | 5/2006 | Kim et al. |
| 7,116,002 | B2 | 10/2006 | Chao et al. |
| 7,138,299 | B2 | 11/2006 | Fjelstad |
| 7,152,311 | B2 | 12/2006 | Beroz et al. |
| 7,166,914 | B2 | 1/2007 | DiStefano et al. |
| 7,202,556 | B2 | 4/2007 | 'Khng et al. |
| 2003/0064547 | A1 | 4/2003 | Akram et al. |
| 2004/0046248 | A1 | 3/2004 | Waelti et al. |
| 2004/0195701 | A1 | 10/2004 | Attarwala |
| 2004/0262742 | A1 | 12/2004 | DiStefano et al. |
| 2005/0002448 | A1 | 1/2005 | Knight et al. |
| 2005/0251282 | A1 | 11/2005 | Farnworth et al. |
| 2005/0268847 | A1 | 12/2005 | Farnworth |
| 2006/0084254 | A1 | 4/2006 | Attarwala |
| 2006/0284312 | A1 | 12/2006 | Lee |
| 2006/0292746 | A1 | 12/2006 | Tan et al. |
| 2007/0007643 | A1* | 1/2007 | Oh et al. ............... 257/701 |
| 2007/0035008 | A1 | 2/2007 | Wu et al. |
| 2007/0072321 | A1 | 3/2007 | Sherrer et al. |
| 2007/0080360 | A1 | 4/2007 | Mirsky et al. |
| 2007/0096160 | A1 | 5/2007 | Beroz et al. |
| 2008/0251875 | A1* | 10/2008 | Wu et al. ................ 257/434 |
| 2008/0283992 | A1* | 11/2008 | Palaniappan et al. ........ 257/686 |

FOREIGN PATENT DOCUMENTS

| | | |
|---|---|---|
| CN | 1197544(A) | 10/1998 |
| DE | 19830475 (A1) | 1/1999 |
| EP | 0800754(A1) | 10/1997 |
| EP | 0853816(A1) | 7/1998 |
| EP | 0870325(A1) | 10/1998 |
| EP | 0956745(A1) | 11/1999 |
| JP | 8055881(A) | 2/1996 |
| JP | 10256314(A) | 9/1998 |
| JP | 11054692(A) | 2/1999 |
| JP | 2000260909 A | 9/2000 |
| JP | 2004186700 (A) | 7/2004 |
| JP | 2006-294437 | 10/2006 |
| KR | 20030047405 | 6/2003 |
| WO | WO9602068 A1 | 1/1996 |
| WO | WO9609746 A1 | 3/1996 |
| WO | WO/97/11588 | 3/1997 |
| WO | WO9711486(A1) | 3/1997 |
| WO | WO/98/28955 | 2/1998 |
| WO | WO9844564 A1 | 10/1998 |
| WO | WO9940763 A1 | 8/1999 |
| WO | WO0055913 A1 | 9/2000 |

OTHER PUBLICATIONS

PCT Search Report Application No. PCT/US 08/63348 dated Aug. 20, 2009.

Ryszard Kisiel and Zbigniew Szczepanski, "Trends in assembling of advanced IC packages", Journal of Telecommunications and Information Technology, Jan. 2005, pp. 63-69.

H. A. C. Tilmans et al., "Wafer-level packages RF-MEMS switches fabricated in a CMOS fab", Electron Devices Meeting, IEDM Technical Digest, international publication date 2001, pp. 41.4.1-41.4.4.

Wei H. Koh, "Advanced Area Array Packaging-From CSP to WLP", Kingston Technology Company, USA, Electronic Packaging Technology Proceedings, 2003, ICEPT 2003, Oct. 28-30, 2003, pp. 121-125.

A. Jourdain et al., "Investigation of the Hermeticity of BCB-Sealed Cavities for Housing (RF-)Mems Devices", Micro Electro Mechanical Systems, 2003, The Fifteenth IEEE International Conference, pp. 677-680.

Written Opinion and Search Report from the Australian Patent Office dated Dec. 24, 2007 from Application No. SG 200703559-5, pp. 1-10.

* cited by examiner

SEMICONDUCTOR PACKAGE HAVING DIE WITH RECESS AND DISCRETE COMPONENT EMBEDDED WITHIN THE RECESS

BACKGROUND

One problem that occurs in electronic systems containing semiconductor packages, such as modules and printed circuit boards (PCB), is parasitic inductance. For example, parasitic inductance can occur from switching transients and cross coupling between the conductors (e.g., wires or traces) that electrically connect different semiconductor packages of the system. Parasitic inductance can cause transient voltages, spurious signals, and power supply noise, which degrade the operation of the semiconductor packages, and adversely affect the performance of the system. Parasitic inductance can also make testing more difficult because false readings are obtained, making electrical evaluation of the system more difficult.

One technique for overcoming parasitic inductance is by filtering the transient voltages, spurious signals and power supply noise. For example, external decoupling capacitors can be surface mounted on a system substrate, such as a printed circuit board (PCB) or test board, in close proximity to the semiconductor packages.

As the operating speeds of electronic systems increase, the problems associated with parasitic inductance increase. For example, the parasitic inductance associated with circuit connections to the decoupling capacitors decreases their effectiveness at higher speeds. Parasitic inductance is particularly a problem at clocking speeds of 500 mHz or more.

Electronic systems are also becoming more densely populated. External decoupling capacitors require valuable amounts of surface area on substrates, which could be utilized for other components and circuits. Yet another problem with external decoupling capacitors is that they are susceptible to shorting, and also to mechanical damage due to their surface mounting.

In view of these shortcomings associated with external decoupling capacitors, semiconductor packages have been constructed with on-board capacitors. For example, U.S. Pat. Nos. 6,891,248; 7,002,248 and 7,041,537 to Akram et al. disclose semiconductor packages having on board capacitors. In these patents, redistribution layers on the packages are used to form integrated capacitors having electrodes separated by dielectric layers.

The present disclosure is directed to semiconductor packages having discrete components that are embedded in an active die of the package. The present disclosure is also directed to a method for fabricating semiconductor packages with discrete components, and to electronic systems containing the semiconductor packages.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1A:
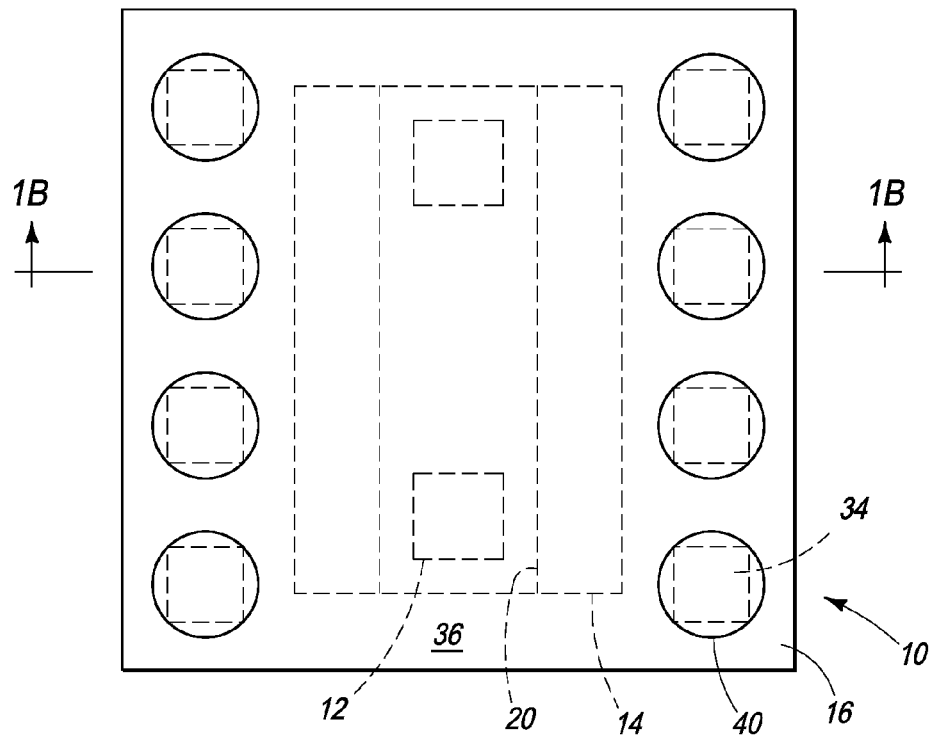
FIG. 1A is an enlarged schematic bottom view of a semiconductor package having discrete components.
Figure 1B:
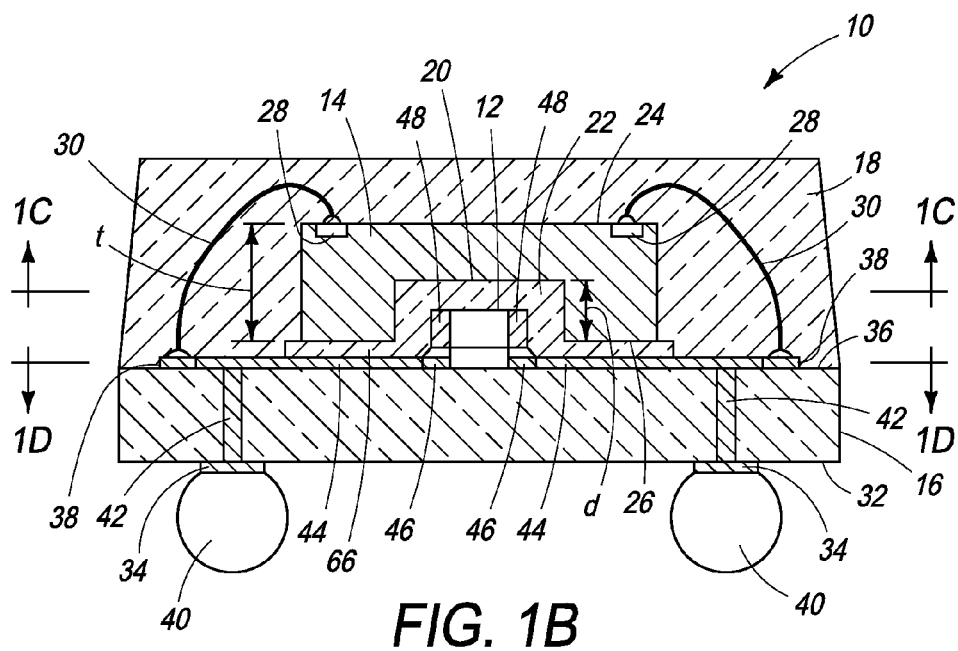
FIG. 1B is an enlarged schematic cross sectional view of the package taken along section line 1B-1B of FIG. 1A.

Referring to FIGS. 1A-1D, a semiconductor package 10 having discrete components 12 is illustrated. As shown in FIG. 1B, the package 10 includes a semiconductor die 14; a substrate 16 bonded to the die 14; and an encapsulant 18 encapsulating the die 14. As will be further explained, the discrete components 12 are embedded in a recess 20 in the die 14 encapsulated by a die attach polymer 22.

For illustrative purposes, the package 10 includes two discrete components 12. However, the package 10 can include any number of discrete components 12. In addition, the discrete components 12 can comprise any conventional component used in the art including capacitors, resistors and inductors. As another alternative, the discrete components 12 can comprise semiconductor dice containing active integrated circuits (ICs) having a desired electrical configuration (e.g., logic, memory, processing). Also for illustrative purposes, the discrete components 12 in the package 10 are both the same type of component (e.g., decoupling capacitors). However, the package 10 can include different types of discrete components, such as a first type of discrete component (e.g., a decoupling capacitor) and a second type of discrete component (e.g., a SMT resistor).

The discrete components 12 embedded in the die 14 significantly improve the performance of the package 10. For example, with discrete components 12 in the form of decoupling capacitors, the conductive path to the die 14 has a shorter length relative to that of external decoupling capacitors on a system substrate, such as a module substrate or PCB. The shorter conductive path provides better power integrity and lower inductance. In addition, the embedded mounting of the discrete components 12 requires no additional space, and frees space on the system substrate that would otherwise be required for external decoupling capacitors.

The die 14 (FIG. 1B) includes a semiconductor substrate, such as silicon or gallium arsenide, containing integrated circuits fabricated using well known processes. The die 14 can comprise a high speed digital logic device, such as a dynamic random access memory (DRAM), a static random access memory (SRAM), a SDRAM (synchronous dynamic random access memory), a DDR SDRAM (double data rate DRAM), a SGRAM (synchronous graphics random access memory), a flash memory, a microprocessor, a digital signal processor (DSP), an application specific integrated circuit (ASIC), a MEMS type device (e.g., accelerometer, microphone, speaker, electro mechanical device), or a solar cell. In addition, the die 14 can comprise a tested die that has been certified as a known good die (KGD).

Figure 1C:
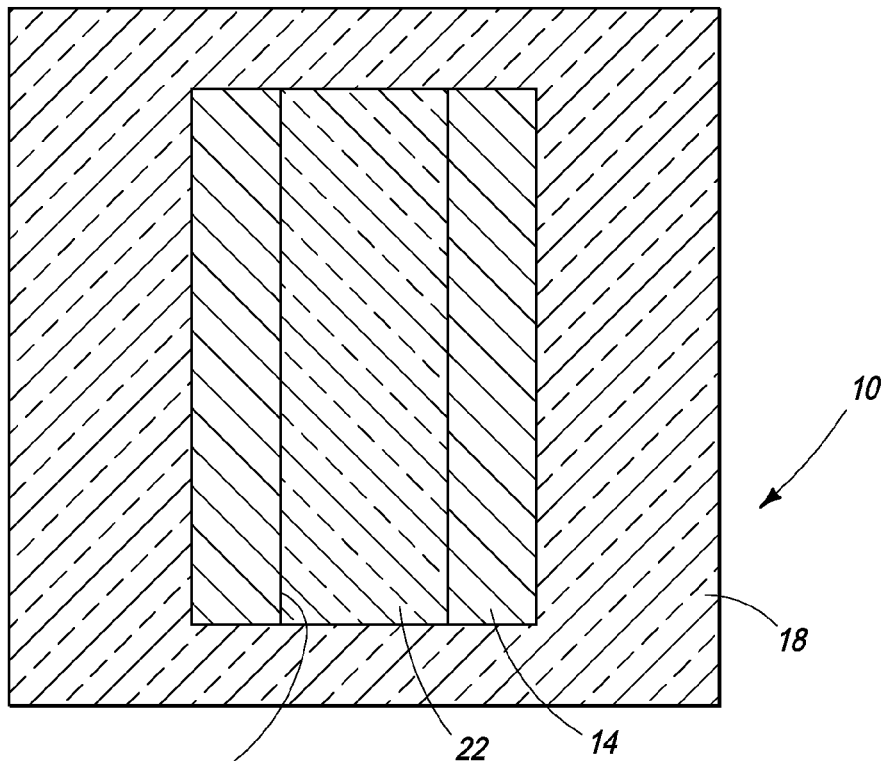
FIG. 1C is an enlarged schematic cross sectional view of the package taken along section line 1C-1C of FIG. 1A.

The die 14 (FIG. 1B) includes a circuit side 24 (face) and a back side 26. A thickness of the die 14 can be conventional with a thickness t of between about 0.3 mm and 0.5 mm being representative. In addition, the recess 20 can be formed in the back side 26 of the die 14 to a selected depth (d). The depth (d) is preferably greater than a thickness and height (h) (FIG. 4A) of the discrete components 12, such that the discrete components 12 are contained in the recess 20. As shown in FIG. 1C, the die 14 includes only one recess 20 which comprises an elongated slot extending from opposing edges of the die 14 configured to contain multiple discrete components 12. Alternately, as shown in FIG. 1E, an alternate embodiment pocket die 14P can include pocket recesses 20P, with each pocket recess 20P configured as a enclosed pocket, sized and shaped to contain one or more discrete components 12. In FIG. 1E, three pocket recesses 20P are illustrated with a discrete component 12 for each pocket recess 20P. However, the pocket die 14P can include any desired number of pocket recesses 20P, and each pocket recess 20P can be configured to contain any number of discrete components 12.

The die 14 (FIG. 1B) also includes a pattern of die contacts 28 on the circuit side 24 in electrical communication with the integrated circuits contained on the die 14. The die contacts 28 can comprise bond pads, or redistribution pads, in a selected pattern (e.g., edge array, center array, grid array), having a selected size and shape (e.g., square, rectangular, round). In addition, the die contacts 28 can be formed of a bondable material (e.g., aluminum, gold, copper) that permits wires 30, or other interconnects (e.g., TAB tape), to be bonded to the die contacts 28.

The substrate 16 (FIG. 1B) of the package 10 can comprise an electrically insulating material, such as an organic polymer resin reinforced with glass fibers. Such a material is sometimes referred to as a "circuit board" material, such that the substrate 16 can also be referred to as a "board", and the package 10 as a chip-on-board package. Suitable materials for the substrate 16 include bismaleimide-trizine (BT), epoxy resins ("FR-4" and "FR-5"), and polyimide resins. A representative thickness of the substrate 16 can be from about 0.2 mm to 1.6 mm.

The substrate 16 (FIG. 1B) includes a back side 32 having an array of terminal contact pads 34, and a circuit side 36 having an array of wire bonding contacts 38, also known as inner lead bonds (ILB). Terminal contacts 40 (FIG. 1B) for the package 10 (also known as outer lead bonds (OLB), are formed on the terminal contact pads 34. The terminal contacts 40 can comprise metal, or solder, balls, bumps or pins, formed on the terminal contact pads 34 using a metallization process, a stud bumping process or a ball bonding process. A representative range for the diameter of the terminal contacts 40 can be from 60-500 µm. In addition, the terminal contact pads 34 and the terminal contacts 40, can be formed in an area array, such as a ball grid array, a pin grid array, an edge array or a center array.

As shown in FIG. 1B, the substrate 16 also includes conductive vias 42, which electrically connect the terminal contact pads 34 on the back side 32 of the substrate 16 to the wire bonding contacts 38 on the circuit side 36 of the substrate 16. As shown in FIG. 1B, the wires 30 are bonded at a first end to the die contacts 28 on the die 14, and at a second end to the wire bonding contacts 38 on the substrate 16. As with the die contacts 28, the wire bonding contacts 38 can comprise a bondable metal, such as aluminum, copper or gold, which allows the wires 30 to be bonded using a conventional wire bonding process, such as thermocompression (T/C) bonding, thermosonic (T/S) bonding, or ultrasonic (U/S) bonding. Using a wire bonding process, the first bond between the wire 30 and the die contact 28 can comprise a ball bond, and the second bond between the wire 30 and the wire bonding contact 38 can comprise a wedge bond.

Figure 1D:
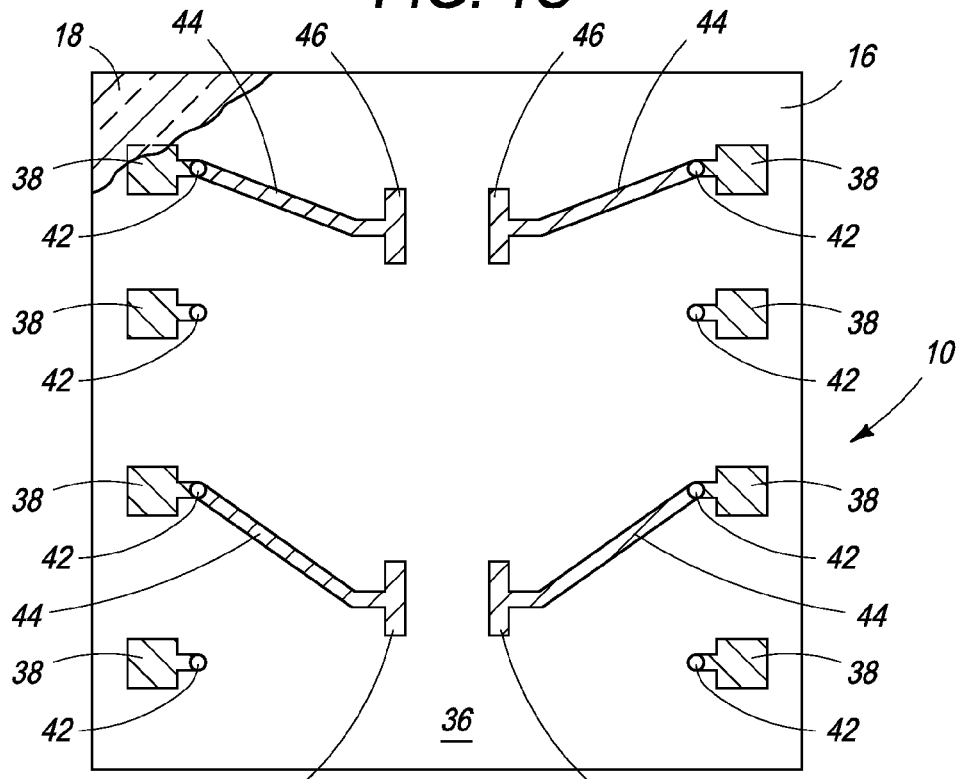
FIG. 1D is an enlarged schematic cross sectional view of the package with parts cut away taken along section line 1D-1D of FIG. 1A.
Figure 1E:
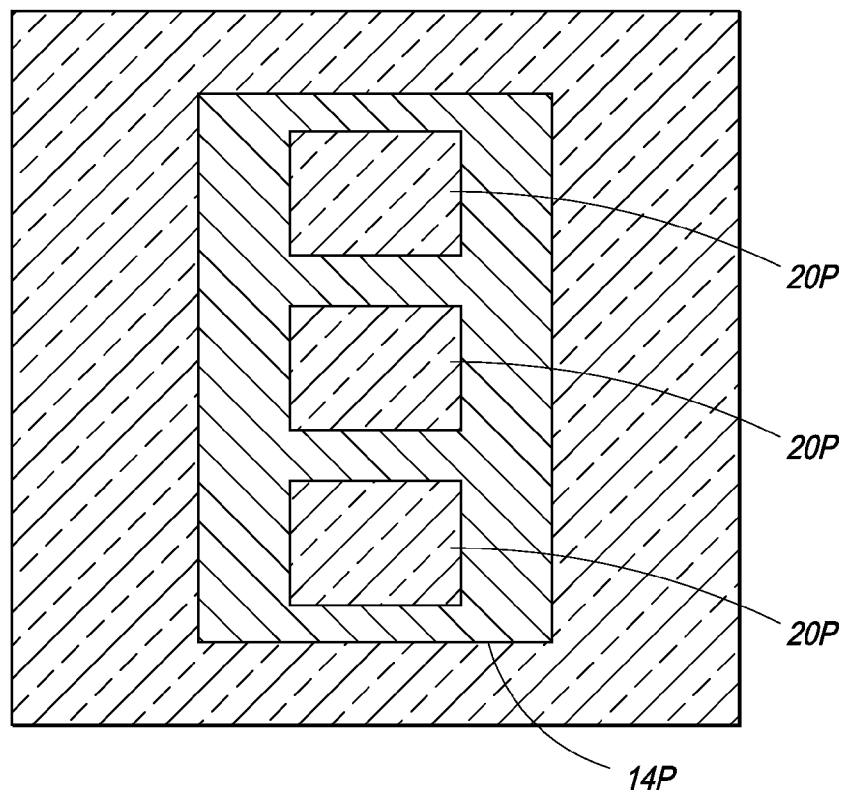
FIG. 1E is an enlarged schematic cross sectional view of an alternate embodiment package equivalent to FIG. 1C having die pockets.

As shown in FIG. 1D, some of the wire bonding contacts 38 are in electrical communication with conductors 44 and component contacts 46. As shown in FIG. 1B, the component contacts 46 are electrically connected to terminals 48 on the discrete components 12. This arrangement provides separate electrical paths from the discrete components 12 (FIG. 1B) through the conductors 44 to selected wire bonding contacts 38 and wires 30 to selected die contacts 28. In addition, separate electrical paths are provided from selected terminal contacts 40 through the vias 42 and the conductors 44 to the discrete components 12.

For illustrative purposes, the package 10 includes only eight terminal contacts 40, and eight wire bonding contacts 38 electrically connected to eight die contacts 28. However, in actual practice the package 10 can include any number of terminal contacts 40, wire bonding contacts 38 and die contacts 28 (e.g., tens to hundreds). In addition, the terminals 48 for the discrete components 12 can be electrically connected to selected terminal contacts 40 and selected die contacts 28 as required. For example, for discrete components 12 in the form of decoupling capacitors, first terminals 48 thereof can be connected to ground (Vss) die contacts 28, and to ground (Vss) terminal contacts 40. Second terminals 48 of the discrete components 12 can be connected to power (Vcc) die contacts 28 and to power (Vcc) terminal contacts 40.

The die attach polymer 22 (FIG. 1B) attaches the die 14 to the substrate 16 (FIG. 1B). In addition, the die attach polymer 22 fills the recess 20 in the die 14, and encapsulates the discrete components 12. The discrete components 12 are thus embedded in the die 14 and electrically insulated from the die 14 by the die attach polymer 22. The die attach polymer 22 can comprise a curable polymer such as a silicone, a polyimide or an epoxy material. As shown in FIG. 1B, the die attach polymer 22 includes a relatively thin layer 66 between the back side 26 of the die 14 and the circuit side 36 of the substrate 16 which attaches the die 14 to the substrate 16. In addition, the die attach polymer 22 has a relatively thick portion that fills the recess 20 in the die 14 and encapsulates the discrete components 12.

As shown in FIG. 1B, the encapsulant 18 forms a package body which encapsulates the die 14, the wires 30, and the circuit side 36 of the substrate 16. The encapsulant 18 can comprise an epoxy resin molded using conventional molding equipment and techniques. A thickness and an outline of the encapsulant 18 can be selected as required.

Figure 2:
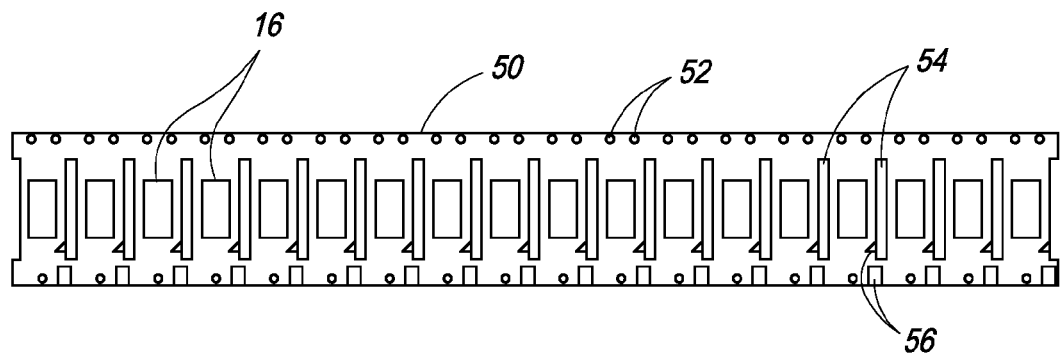
FIG. 2 is a schematic plan view of a strip containing substrates for fabricating multiple semiconductor packages.

Referring to FIG. 2, as a first step in a method for fabricating the semiconductor package 10 (FIG. 1B), a panel 50 containing multiple substrates 16 can be provided. Each substrate 16 is a segment of the panel 50 (FIG. 2), and will subsequently be separated from the adjacent substrates 16 to form the semiconductor package 10. The panel 50 (FIG. 2) can include indexing openings 52 for handling by automated equipment, such as chip bonders, wire bonders, molds and trim machinery. The panel 50 (FIG. 2) can also include separation openings 54 which facilitate separation of the substrates 16 into the packages 10. The panel 50 can also include metal segments 56, such as pin one indicators and mold compound gate breaks.

Each substrate 16 (FIG. 2) on the panel 50 (FIG. 2) includes the terminal contact pads 34 (FIG. 1B) on the back side 32 (FIG. 1B), and the conductive vias 42 (FIG. 1B) in electrical communication with the terminal contact pads 34 (FIG. 1B). Each substrate 16 also includes the conductors 44 (FIG. 1B) on the circuit side 36 (FIG. 1B) in electrical communication with the conductive vias 42 (FIG. 1B) having the wire bonding contacts 38 (FIG. 1B) and the component contacts 46 (FIG. 1B). All of the elements of the panel 50 and the substrates 16 can be constructed using well known techniques and equipment.

Figure 3A:
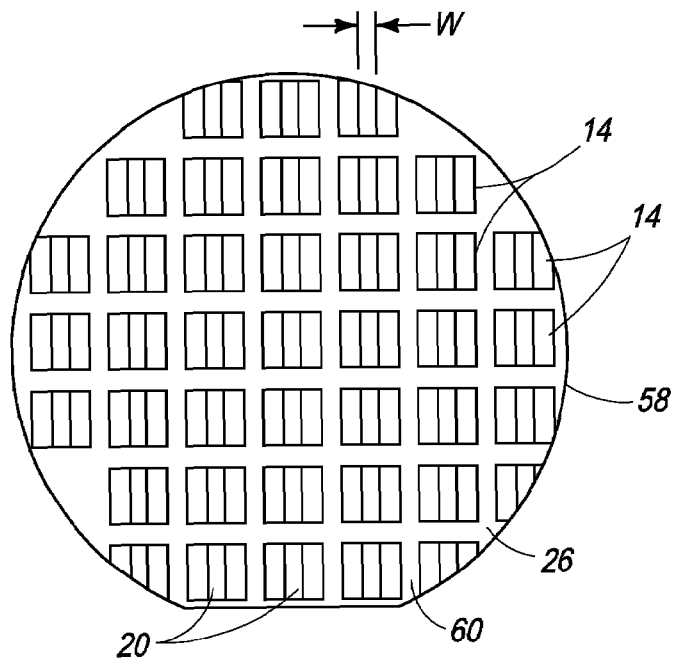
FIG. 3A is a schematic plan view of a semiconductor wafer containing multiple dice having etched recesses for fabricating the semiconductor package.

Referring to FIG. 3A, as a second step in the method for fabricating the semiconductor package 10 (FIG. 1B), a semiconductor wafer 58 containing multiple semiconductor dice 14 can be provided. The dice 14 can comprise conventional semiconductor dice having integrated circuits with a desired electrical configuration, as previously described. The dice 14 are separated by streets 60, and the back side 26 of the wafer 58 corresponds to the back sides 26 of the dice 14.

As shown in FIG. 3A, each die 14 includes a recess 20 having a selected width (w) and a selected depth (d) (FIG. 1B). The recesses 20 can be formed by etching the back side 26 of the wafer 58. An etching process can also be used to form the pocket die 14P (FIG. 1E) with the pocket recesses 20P (FIG. 1E). For example, the etching process can comprise a wet etch process or a dry etch process performed using a mask, such as a photo mask or a hard mask, having openings with a size and shape corresponding to the recesses 20 or 20P (FIG. 1E). The depth (d) of the recesses 20 can be controlled by endpointing the etch process at a selected depth. For wet etching silicon, one suitable wet etchant comprises tetramethylammoniumhydroxide (TMAH). For dry etching silicon, reactive ion etching (RIE) can be performed in a reactor with an etch gas, such as $CF_4$, $SF_6$, $Cl_2$ or $CCl_2F_2$.

Figure 3B:
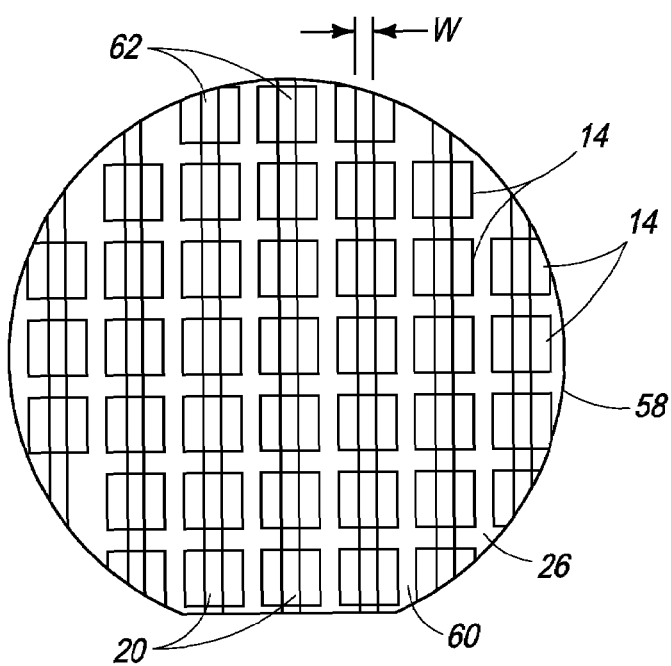
FIG. 3B is a schematic plan view of a semiconductor wafer containing multiple dice having saw cut recesses for fabricating the semiconductor package.

Referring to FIG. 3B, as an alternative to etching, the recesses 20 can be formed using a sawing process. In this case, saw cuts 62 can formed on the back side 26 of the semiconductor wafer 58 using a conventional dicing saw having a saw blade with a width that corresponds to the width (w) of the recesses 20. In addition, the sawing process can be controlled to form the saw cuts 62 with the depth (d).

With either the etching method (FIG. 3A), or the sawing method (FIG. 3B), following formation of the recesses 20 (or 20P-FIG. 1E), the wafer 58 can be singulated into individual dice 14. The singulating step can be performed using a sawing process, an etching process or a water jet process.

Figure 4A:
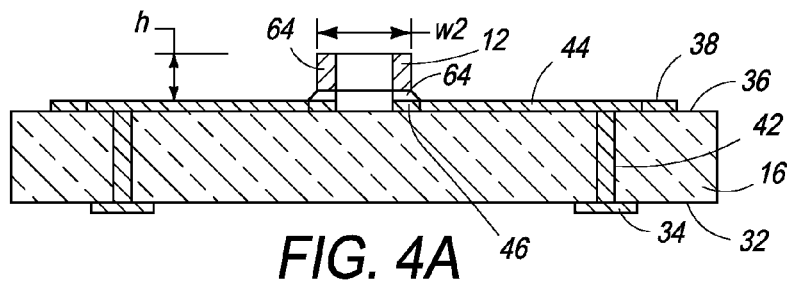
FIGS. 4A-4D are schematic cross sectional views illustrating steps in the method for fabricating the semiconductor package.

Referring to FIGS. 4A-4D, additional steps in the method for fabricating the package 10 (FIG. 1B) are illustrated. Although these steps are illustrated as being performed on a single substrate 16, it is to be understood that they can be performed on all of the substrates 16 on the panel 50 (FIG. 2) at the same time. As shown in FIG. 4A, the substrate 16 can be provided with the terminal contact pads 34 on the back side 32 in electrical communication with the conductive vias 42. In addition, the conductors 44 can be provided on the circuit side 36 in electrical communication with the conductive vias 42 and having the wire bonding contacts 38 and the component contacts 46.

As also shown in FIG. 4A, the discrete components 12 are provided, and bonded to the component contacts 46. The discrete components 12 can include component electrodes 64 that are soldered, brazed, welded or otherwise attached (e.g., conductive adhesive) to the component contacts 46 on the substrate 16. The discrete components 12 can be placed on the component contacts 46 using conventional pick and place equipment, and then bonded to the component contacts 46 using conventional techniques (e.g., soldering). In addition, the discrete components 12 have a height (h) on the substrate 16 that is less than the depth (d) (FIG. 4) of the semiconductor die 14. The discrete components 12 also have a width (w2) that is less than the width (w) (FIG. 4B) of the recess 20 in the die 14. These dimensions permit the discrete components 12 to be contained within the recess 20, and the die attach polymer 22 to surround and encapsulate the discrete components 12 within the recess 20.

Figure 4B:
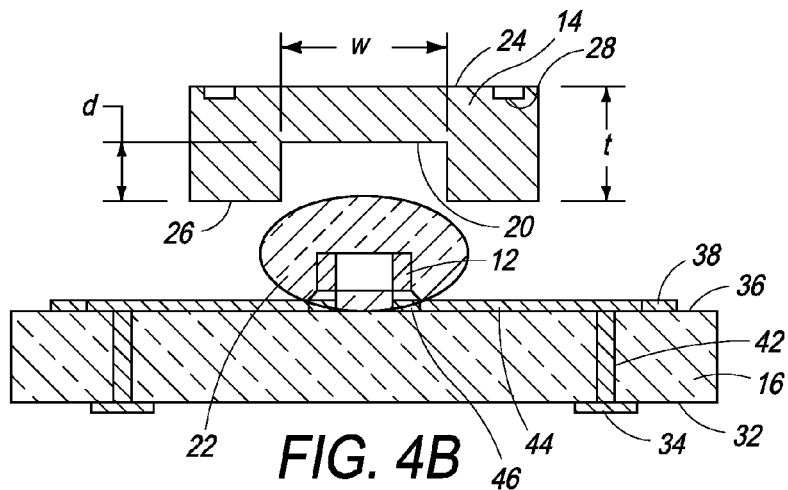

Next, as shown in FIG. 4B, the die attach polymer 22 is applied in viscous form to the discrete components 12. The die attach polymer 22 can comprise a conventional silicone, polyimide or epoxy die attach material. In addition, a selected volume of the die attach polymer 22 can be deposited as a glob top on the discrete components 12 using a conventional die attach system. However, any suitable process, such as screen printing, deposition through a nozzle, or capillary injection can be used to deposit the die attach polymer 22 on the discrete components 12. The deposited volume of die attach polymer 22 can be selected to fill the recess 20 in the die 14, and to encapsulate the discrete components 12 in the recess 20. In addition to filling the recess 20, the die attach polymer 22 will also form the adhesive layer 66 (FIG. 4C) which attaches the die 14 to the substrate 16.

As also shown in FIG. 4B, the die 14 can be provided with the recess 20 having the selected width (w) and depth (d). The die 14 can then be placed on the viscous die attach polymer 22 and pressed onto the substrate 16 using suitable equipment, such as a conventional die attach system or a pick and place mechanism. In addition, the die 14 is placed on the die attach polymer 22, such that the recess 20 aligns with the discrete components 12 on the substrate 16.

Figure 4C:
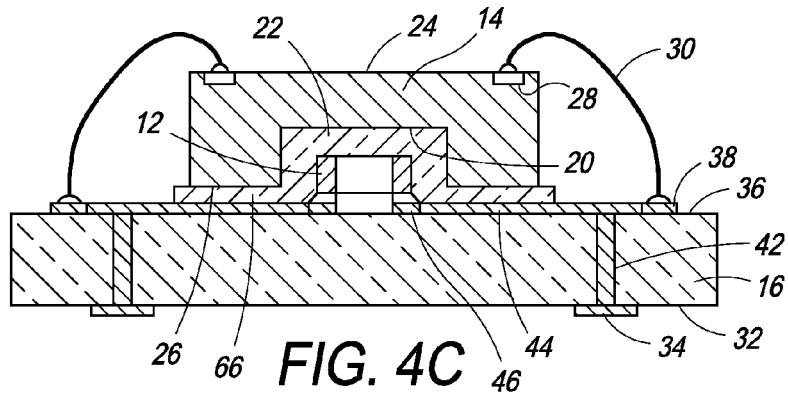

As shown in FIG. 4C, pressing the die 14 into the die attach polymer 22 forms the adhesive layer 66 which attaches the die 14 to the substrate 16. In addition, the viscous die attach polymer 22 deforms to completely fill the recess 20 and encapsulate the discrete components 12. Following placement of the die 14 on the substrate 16, the die attach polymer 22 can be cured at a required temperature and for a required time period.

As also shown in FIG. 4C, the die 14 can be placed in electrical communication with the discrete components 12 by bonding the wires 30 to the die contacts 28 on the die 14, and to the wire bonding contacts 38 on the substrate 16. This step can be performed using conventional equipment such as a wire bonder or in the case of TAB interconnects a TAB bonder.

Figure 4D:
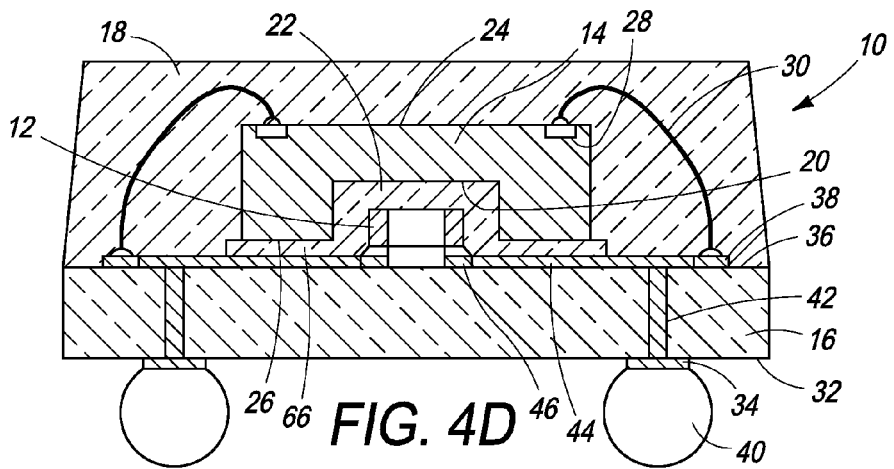

Next, as shown in FIG. 4D, the encapsulant 18 can be formed using conventional equipment such as molding machinery. In addition, the terminal contacts 40 can be formed on the terminal contacts pads 34 using a suitable process such as a metallization process, a stud bumping process or a ball bonding process.

Figure 5:
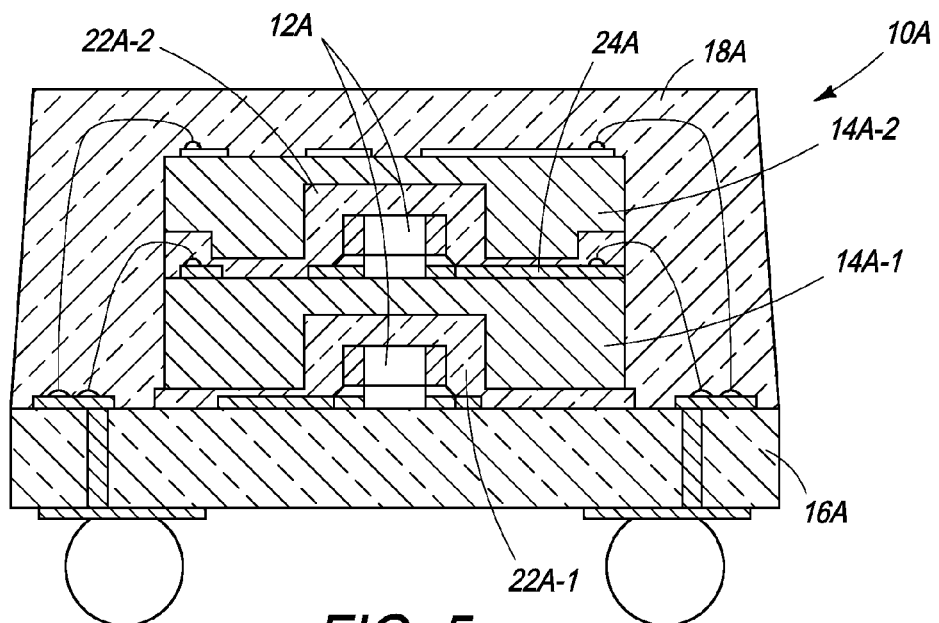
FIG. 5 is an enlarged schematic cross sectional view of a two die semiconductor package having discrete components.

Referring to FIG. 5, a package 10A is substantially similar to the package 10 (FIG. 1B) but has a pair of stacked dice. A first die 14A-1 having discrete components 12A is bonded to a substrate 16A substantially as previously described for die 14 (FIG. 1B). In addition, a second die 14A-2 having discrete components 12A is bonded to the circuit side 24A of the first die 14A-1. An encapsulant 18A encapsulates the dice 14A-1, 14A-2 and forms the body of the package 10A. Further, a first die attach polymer 22A-1 attaches the first die 14A-1 to the substrate 16A, and encapsulates the discrete components 12A on the first die 14A-1. A second die attach polymer 22A-2 attaches the second die 14A-2 to the circuit side 24A of the first die 14A-1, and encapsulates the discrete components 12A on the second die 14A-2. The package 10A can be fabricated substantially as previously described for the package 10 (FIG. 1B).

Figure 6:
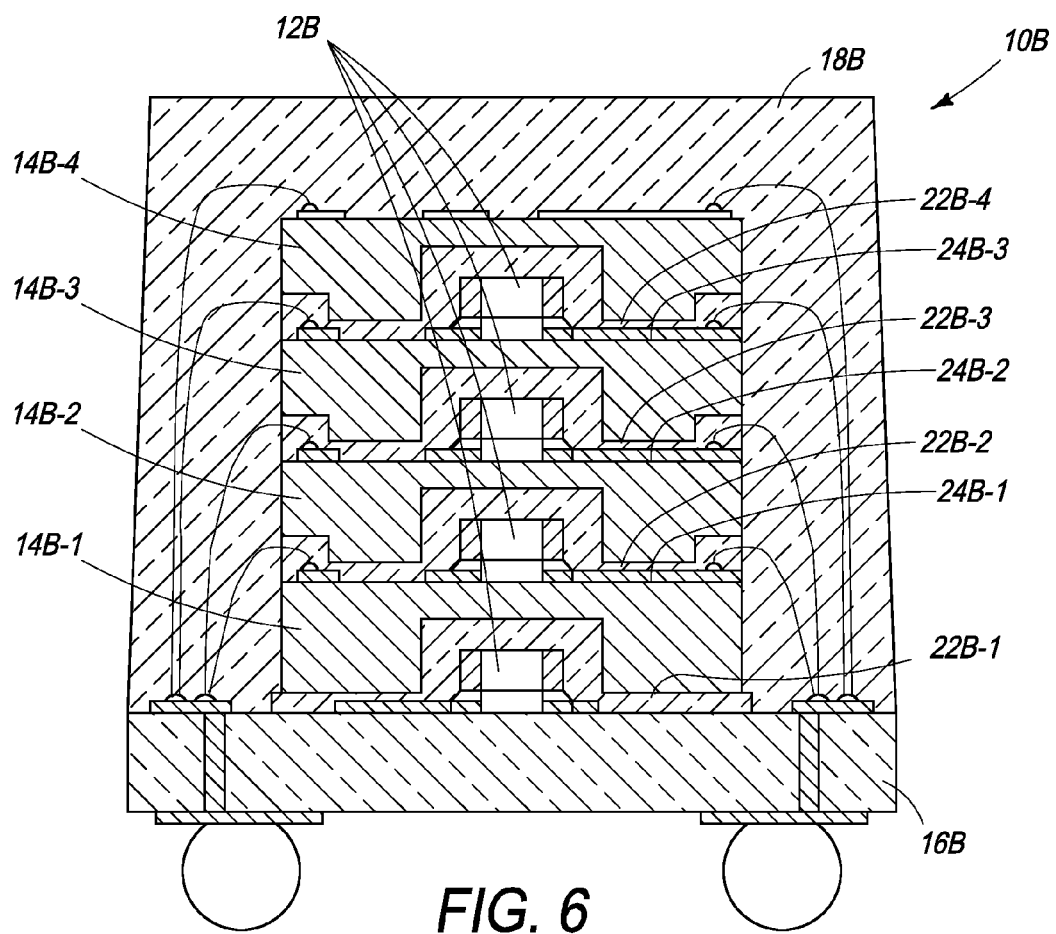
FIG. 6 is an enlarged schematic cross sectional view of a four die semiconductor package having discrete components.

Referring to FIG. 6, a package 10B is substantially similar to the package 10A (FIG. 5) but has four dice in a stacked array. A first die 14B-1 having discrete components 12A is bonded to a substrate 16B substantially as previously described for die 14 (FIG. 1B). In addition, a second die 14B-2 having discrete components 12A is bonded to the circuit side 24B-1 of the first die 14B-1, a third die 14B-3 having discrete components 12A is bonded to the circuit side 24B-2 of the second die 14B-2, and a fourth die 1B-4 having discrete components 12A is boned to the circuit side 24B-3 of the third die 14B-3. An encapsulant 18B encapsulates the dice 14B-1, 14B-2, 14B-3, 14B-4, and forms the body of the package 10B. Further, a first die attach polymer 22B-1 attaches the first die 14B-1 to the substrate 16B, and encapsulates the discrete components 12B on the first die 14B-1. A second die attach polymer 22B-2 attaches the second die 14B-2 to the circuit side 24B-1 of the first die 14B-1, and encapsulates the discrete components 12B on the second die 14B-2. A third die attach polymer 22B-3 attaches the third die 14B-3 to the circuit side 24B-2 of the second die 14B-2, and encapsulates the discrete components 12B on the third die 14B-3. A fourth die attach polymer 22B-4 attaches the fourth die 14B-4 to the circuit side 24B-3 of the third die 14B-3, and encapsulates the discrete components 12B on the fourth die 14B-4. The package 10B can be fabricated substantially as previously described for the package 10 (FIG. 1B).

Figure 7:
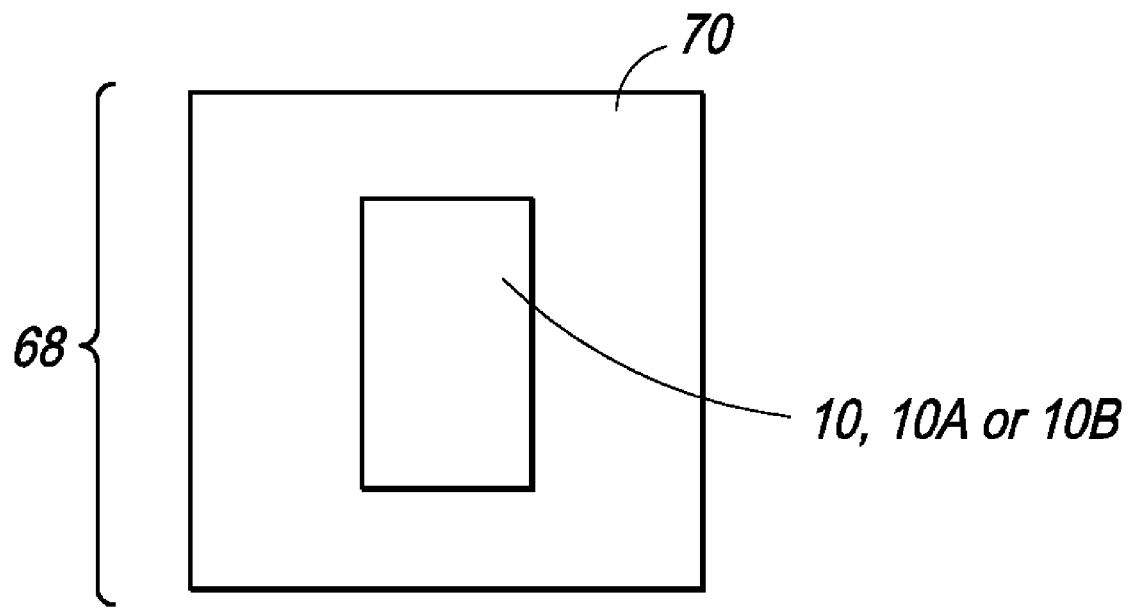
FIG. 7 is a schematic diagram of a system incorporating the semiconductor packages.

The semiconductor package 10 (FIG. 1B) or 10A (FIG. 5) or 10B (FIG. 6) can be used as a stand alone device, and in combination with other semiconductor components to fabricate semiconductor systems for consumer products (e.g., cell phones, camcorders) and computers. As shown in FIG. 7, an electronic system 68 can include a system substrate 70, such as a module substrate, a printed circuit board, or a computer mother board wherein the semiconductor component 10 (FIG. 1B) or 10A (FIG. 5) or 10B (FIG. 6) is mounted.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

We claim:
1. A semiconductor package comprising:
a substrate comprising a plurality of terminal contacts, a plurality of conductors on the substrate having a plurality of bonding contacts, and a plurality of conductive vias electrically connecting the terminal contacts and the conductors;
a semiconductor die mounted to the substrate in a chip on board configuration, the die comprising a circuit side, a semiconductor substrate, a back side, a recess in the semiconductor substrate on the back side, and a plurality of die contacts on the circuit side;
at least one discrete component embedded in the semiconductor substrate of the die within the recess;
a die attach polymer having a portion in the recess encapsulating the discrete component in the recess and a layer between the die and the substrate attaching the die to the substrate; and
a plurality of interconnects bonded to the die contacts and to the bonding contacts.

2. The package of claim 1 wherein the recess has a depth (d) in the semiconductor substrate greater than a height (h) of the discrete component on the substrate, and the recess in the semiconductor substrate has a first width (w1) greater than a second width (w2) of the discrete component on the substrate.

3. The package of claim 1 wherein the interconnects comprise wire bonded wires.

4. The package of claim 1 wherein the discrete component comprises a decoupling capacitor.

5. The package of claim 1 wherein the recess comprises an elongated slot extending from opposing edges of the die.

6. The package of claim 1 wherein the recess comprises a pocket.

7. The package of claim 1 wherein the die attach polymer comprises a polymer selected from the group consisting of polyimide, silicone and epoxy.

8. The package of claim 1 further comprising a second semiconductor die stacked on the die having a second semiconductor substrate and a second recess in the second semiconductor substrate and at least one second discrete component encapsulated by a second die attach polymer attaching the second semiconductor die to the die.

9. The package of claim 1 further comprising a plurality of second semiconductor die stacked on the die having a plurality of second recesses and a plurality of second discrete components encapsulated by a plurality of second die attach polymers attaching the second semiconductor dice in a stacked array.

10. The package of claim 1 wherein the package is mounted to a system substrate in an electronic system.

* * * * *

UNITED STATES PATENT AND TRADEMARK OFFICE
CERTIFICATE OF CORRECTION

PATENT NO. : 7,723,831 B2 Page 1 of 1
APPLICATION NO. : 11/767889
DATED : May 25, 2010
INVENTOR(S) : Chua Swee Kwang et al.

It is certified that error appears in the above-identified patent and that said Letters Patent is hereby corrected as shown below:

In column 8, line 44, in Claim 9, delete "die" and insert -- dice --, therefor.

Signed and Sealed this

Twentieth Day of July, 2010

David J. Kappos
*Director of the United States Patent and Trademark Office*